(12) United States Patent
Wiggin et al.

(10) Patent No.: US 6,429,672 B2
(45) Date of Patent: *Aug. 6, 2002

(54) CONTAMINATION-TOLERANT ELECTRICAL TEST PROBE

(75) Inventors: Robert N. Wiggin, Poughkeepsie; Yuet-Ying Yu, Hopewell Junction, both of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/107,660

(22) Filed: Jun. 30, 1998

(51) Int. Cl.$^7$ ............................... G01R 31/02
(52) U.S. Cl. .................. 324/761; 324/754; 324/158.1
(58) Field of Search .................. 324/761, 754, 324/755, 158.1; 361/388; 439/66, 67, 482

(56) References Cited

U.S. PATENT DOCUMENTS

| | | | |
|---|---|---|---|
| 3,806,801 A | | 4/1974 | Bove |
| 4,506,215 A | | 3/1985 | Coughlin |
| 4,622,514 A | * | 11/1986 | Lewis ........................ 324/761 |
| 4,686,464 A | * | 8/1987 | Elsasser et al. .......... 324/158.1 |
| 4,764,970 A | | 8/1988 | Hayashi et al. |
| 4,803,424 A | * | 2/1989 | Ierardi et al. ............. 324/158.1 |
| 4,843,315 A | | 6/1989 | Bayer et al. |
| 4,901,013 A | | 2/1990 | Benedetto et al. |
| 5,014,161 A | * | 5/1991 | Lee et al. .................... 361/388 |
| 5,397,996 A | | 3/1995 | Keezer |
| 5,488,314 A | | 1/1996 | Brandt et al. |
| 6,024,579 A | * | 2/2000 | Bennett ........................ 439/66 |

FOREIGN PATENT DOCUMENTS

| | | | |
|---|---|---|---|
| EP | 165331 | 8/1988 | |
| EP | A0635723 A1 | * 1/1995 | ........... G01R/1/073 |
| JP | 58-180953 | 10/1983 | |

OTHER PUBLICATIONS

DeGroat et al., "Finding Shorts in Printed Circuit Boards," IBM Technical Disclosure Bulletin, vol. 12, No. 5, pp. 655–656 (Oct. –1969).

R. F. Stucke, "Test Fixture For Thin Film Measurement," IBM Technical Disclosure Bulletin, vol. 23, No. 7B, pp. 3267–3268 (Dec. –1980).

* cited by examiner

Primary Examiner—Michael J. Sherry
Assistant Examiner—Jimmy Nguyen
(74) Attorney, Agent, or Firm—Ratner & Prestia; Tiffany L. Townsend, Esq.

(57) ABSTRACT

A bed-of-nails type or needle-card type test probe has clusters of parallel buckling beams arranged in a spaced arrangement. The buckling beams are arranged and electrically connected within a cluster so that a contaminant, which may be on the device being tested, does not reduce the accuracy of the test measurements. In particular, the spacing of the buckling beams is such that multiple buckling beams are capable of contacting a single feature on an electronics package to be tested. The buckling beams deflect independently of each other in response to compressive force, and the buckling beams within a cluster are electrically connected in parallel to each other to define redundant, independent conductive paths through the buckling beams. In this way, if a contaminant prevents one of the buckling beams of the cluster from making electrical contact with the feature to be tested, the other one or more of the buckling beams of the cluster will make the required electrical connection.

18 Claims, 3 Drawing Sheets

CONTAMINATION-TOLERANT ELECTRICAL TEST PROBE

TECHNICAL FIELD

The present invention relates generally to probes and, more particularly, to probes for electrical testing of electronic packages and similar devices.

BACKGROUND OF THE INVENTION

Electrical testing of electronic packages and similar devices often requires that temporary mechanical and electrical contact be made between test probes, which are connected to the electronics contained within a test system, and metallic features on the surface of the device under test. Examples of some types of electrical testing include tests for opens and shorts of bare substrates and printed circuit cards, and functional tests of populated electronics packages.

Among the metallic features of electronic packages requiring testing are the input/output or "I/O" pads, generally located on the BSM (bottom side metal) side of a package, such as a ceramic substrate. One type of test probe fixture or head used to test such metallic features is a "bed-of-nails" or "needle card." This test head is generally a grouping of individual, spring-loaded test probes commonly known as "pogo pins." A single pogo pin is positioned in the bed-of-nails or needle-card test fixture for each I/O pad or other metallic feature on the electronic package to be tested. The tip of one pogo pin contacts a corresponding, individual I/O pad to test it. Each pogo pin is a single-beam test probe comprised of a "piston" which slides in and out of a "cylinder." A spring inside of the cylinder exerts a force against the piston, and the outward force of the compressed spring biases the tip of the piston into contact with the I/O pad during the test operation.

Non-conductive contamination on the surface of metallic features under test may prevent effective and accurate testing by the bed-of-nails or needle-card type fixture described above. For example, such contamination can prevent the test probe from making the necessary, low resistance, electrical connection to the metallic feature, thus creating invalid or false test results. Such contamination can manifest itself, for example, as widely scattered pieces of dielectric material which are on the surface of the metallic features.

The testing apparatus, probes, and methods of the current art are often ill equipped to take account of such contamination. Generally, if such contamination is present in a location such that it prevents an electrical connection between the test probe and the metallic feature to be tested, the electronic package is deemed functionally defective. In the case of testing bare ceramic substrates for opens and shorts, if the test system is unable to make the required electrical connection with the area under test, such failure is interpreted, incorrectly, as an undesirable, open circuit. If time and costs allow, the part may be re-tested to verify the validity of such finding, or the substrate may be discarded as defective. In either event, additional time or money is expended as a result of the drawbacks of the current testing methods and apparatus.

It should be noted that difficulties in accurate and efficient electrical testing can arise even when the dielectric contamination is quite small relative to the size of the metallic feature and the tip of the test probe. It is sufficient for the dielectric contaminant to prevent good contact between the tip of the test probe and the metallic feature for the tester to detect, incorrectly, that the metallic feature is flawed with an open. Contaminants with diameters measured in microns have been seen to cause such false opens.

Prior art attempts to address the above-described difficulties have generally not been satisfactory. For example, pogo pin geometry has been varied at the distal, test ends of pogo pins in an attempt to improve electrical contact. The test ends have been equipped with multiple points, such as the so-called "crown-head" pogo pin. The multiple tips at the end of such pogo pins are rigidly connected to each other and are mounted to the same, single spring; therefore, the multiple tips or points move together as a unit. As such, a piece of contaminant encountered by just one of the tips often prevents all tips of the "crown" from making the desired electrical connection.

Certain test probes make use of brush tips, generally comprising multiple, closely packed, pliant filaments. Examples of this approach are found in U.S. Pat. No. 5,397,996, titled "Continuity Tester Using A Brush Topped Probe," and in IBM Technical Disclosure Bulletin, Vol. 12, No. 5, dated October 1969. The single continuity tester uses many strands of wire in a brush to make relatively imprecise contact with the device under test. Accordingly, it is ill suited for testing more closely spaced conductive features or for other test operations requiring the probe to make precisely positioned contact with features under test.

There is thus a need for a test probe which functions more reliably in the presence of non-conductive contaminants on the electrical surface to be tested. There is a further need for such a test probe to be suitable for the ever-shrinking geometries of the electronic packages of today and tomorrow.

SUMMARY OF THE INVENTION

To meet these and other needs, and in view of its purposes, the present invention, according to one of its aspects, provides a multi-point test probe used in a test system for testing a feature of a device. The probe has a test head moveable relative to the device, and a cluster of at least two buckling beams secured to the test head. There may also be more than two buckling beams secured to each cluster of the test head. The buckling beams extend generally outwardly from the test head and terminate in distal ends. The buckling beams have strength characteristics selected so that they establish sufficient electrical contact for testing the device when the test head is moved into the appropriate position in relation to the device. The buckling beams deflect laterally when subjected to an axially compressive force. The distal ends of the buckling beams are spaced from each other by a distance no greater than the maximum linear dimension of the feature being tested. The probe has suitable circuitry to electrically connect each of the buckling beams in parallel to the test system. This physical and electrical arrangement of the buckling beam cluster allows it to make electrical connections to the features under test even if only one of the buckling beams contacts the features.

In accordance with another aspect of the present invention, there are either three or four of the buckling beams, and they extend from spaced locations on mounts on the test head. The beams are spaced in radial increments of 120 degrees in the case of three buckling beams, and 90 degrees in the case of four buckling beams. In accordance with yet another aspect of the present invention, there are multiple clusters of the buckling beams discussed above; the clusters are arranged in a matrix corresponding to an array of features on the device under test. According to still another aspect of the present invention, the beams have substantially the same operative length to define a test plane for the probe coinciding with the distal ends of the beams.

The distal ends of the buckling beams which encounter a contaminant during testing are deflected out of this test plane as the test head moves into its test position.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
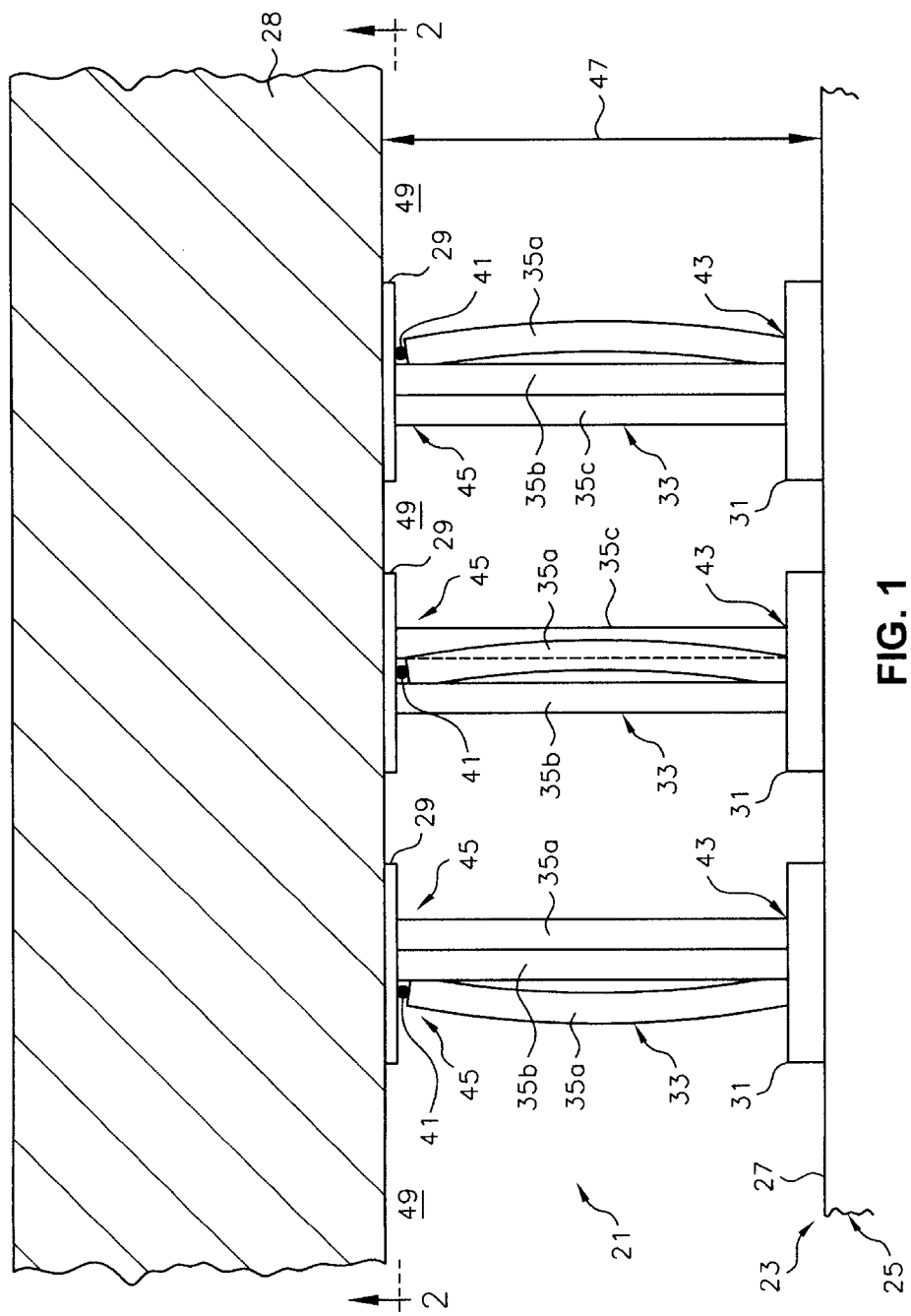
FIG. 1 is an enlarged, side elevational view of a test probe according to the present invention.
Figure 2:
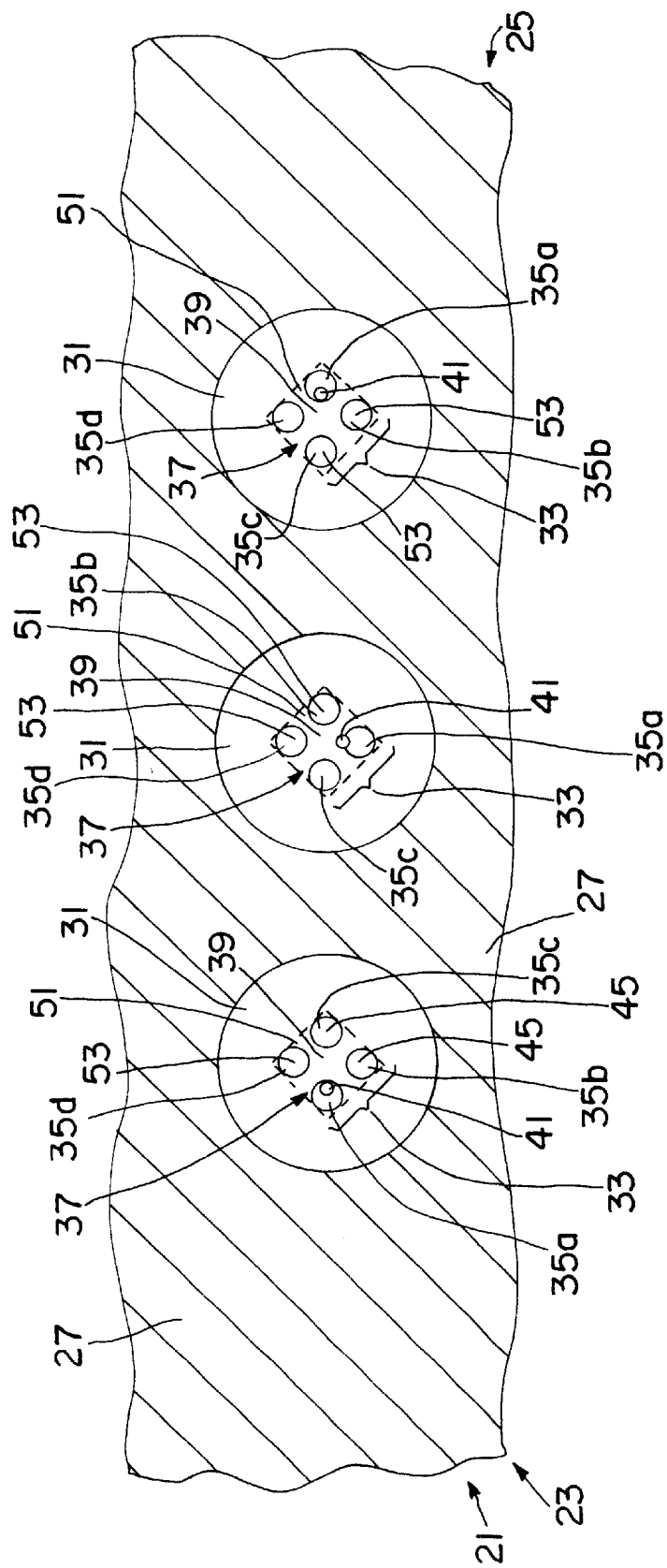
FIG. 2 is a sectional view along the line 2—2 of the probe shown in FIG. 1.

Referring now to the drawing, wherein like reference numerals refer to like elements throughout, FIGS. 1 and 2 show a multi-point test probe 21 according to the present invention. Probe 21 in this embodiment is of the "needle-card" or "bed-of-nails" type, also referred to as an I/O contactor. As such, probe 21 includes a test head 23 which is moved to a predetermined test position by any suitable known mechanism. In its test position, the probe 21 makes electrical contact with I/O pads 29 on the device to be tested.

In this case, the device under test (DUT) is a substrate 28. A space transformer 25 is secured to test head 23 and has a surface 27 with a matrix of mounts 31 (of which three are shown in exemplary fashion) secured at spaced locations along surface 27. The spacing of mounts 31 is selected to correspond to that of the array of I/O pads 29. In this way, when test head 23 is moved into appropriate horizontal alignment with substrate 27, mounts 31 correspond one-for-one to I/O pads 29.

An important aspect of the present invention is the provision of a cluster 33 of buckling beams 35a–35d extending from each of mounts 31. The four buckling beams 35a–35d of each cluster 33 are arranged in a spaced configuration 37 (FIG. 2) with adjacent buckling beams being separated from each other by about a 90-degree arc relative to center 39 of configuration 37.

The composition and structure of buckling beams 35a–35d is in accordance with known buckling beam technology, as set out in European Patent No. 165331 and U.S. Pat. Nos. 4,843,315 and 4,901,013, the teachings of which are incorporated herein by reference. Briefly, buckling beams 35a–35d are fine wires formed of electrically conductive material, such as copper-beryllium. Although mounts 31 hold buckling beams 35a–35d in the spaced configuration 37, additional parallel plates (not shown), with suitable apertures for receiving the buckling beams 35a–35d through the plates, are preferably secured to test head 23 and used to secure the buckling beams 35a–35d to test head 23.

Buckling beams 35a–35d are electrically connected to space transformer 25. The structure of space transformers and space transformer dies is disclosed in U.S. Pat. No. 3,806,801, issued on Apr. 23, 1974, to Ronald Bove, as well as in U.S. Pat. No. 4,622,514, issued on Nov. 11, 1986, to Stephan P. Lewis, both assigned to the common corporate assignee. Space transformer 25, in turn, connects the balance of the test system to the probe 21 and its clusters 33 of buckling beams 35a–35d. Each of the buckling beams 35a–35d is thus electrically connected in parallel to its corresponding mount 31, forming an independent conductive path.

Buckling beams 35a–35d deflect laterally in response to axially compressive force. This lateral deflection is typically used to improve electrical contact between the deflected beam and the area under test. In the present invention, and referring to the example shown in FIGS. 1 and 2, buckling beam 35a in each cluster contacts contaminant 41 during movement of the test head 23 into its test position. The vertical dimension of contaminant 41 causes beam 35a to deflect laterally as test head 23 continues to move into its test position (FIG. 1). The lateral deflection of beams 35a allows the clusters 33 to advance to their test position and permits the remaining buckling beams 35b–35d to make electric contact with corresponding I/O pads 29.

The physical and electrical arrangement, as discussed in further detail below, allows the clusters 33 to make electrical contact with their corresponding I/O pads 29, so long as at least one of the buckling beams 35a–35d does not contact contaminant 41. In turn, this arrangement improves the number of electrical contacts made between the array of I/O pads 29 and the corresponding matrix of clusters 33.

The probe 21 is thus contaminant tolerant in the sense that its accuracy and efficiency at testing is not generally compromised by contaminant 41 on portions of the pads 29 under test. Multiple buckling beams 35a–35d contact a single one of the I/O pads. Each of the buckling beams is able to independently deflect as well as bias against pads 29. Furthermore, the buckling beams 35a–35d are electrically connected in parallel, thus providing independent, redundant electrical paths from the corresponding I/O pad 29 back to the test system.

Figure 3:
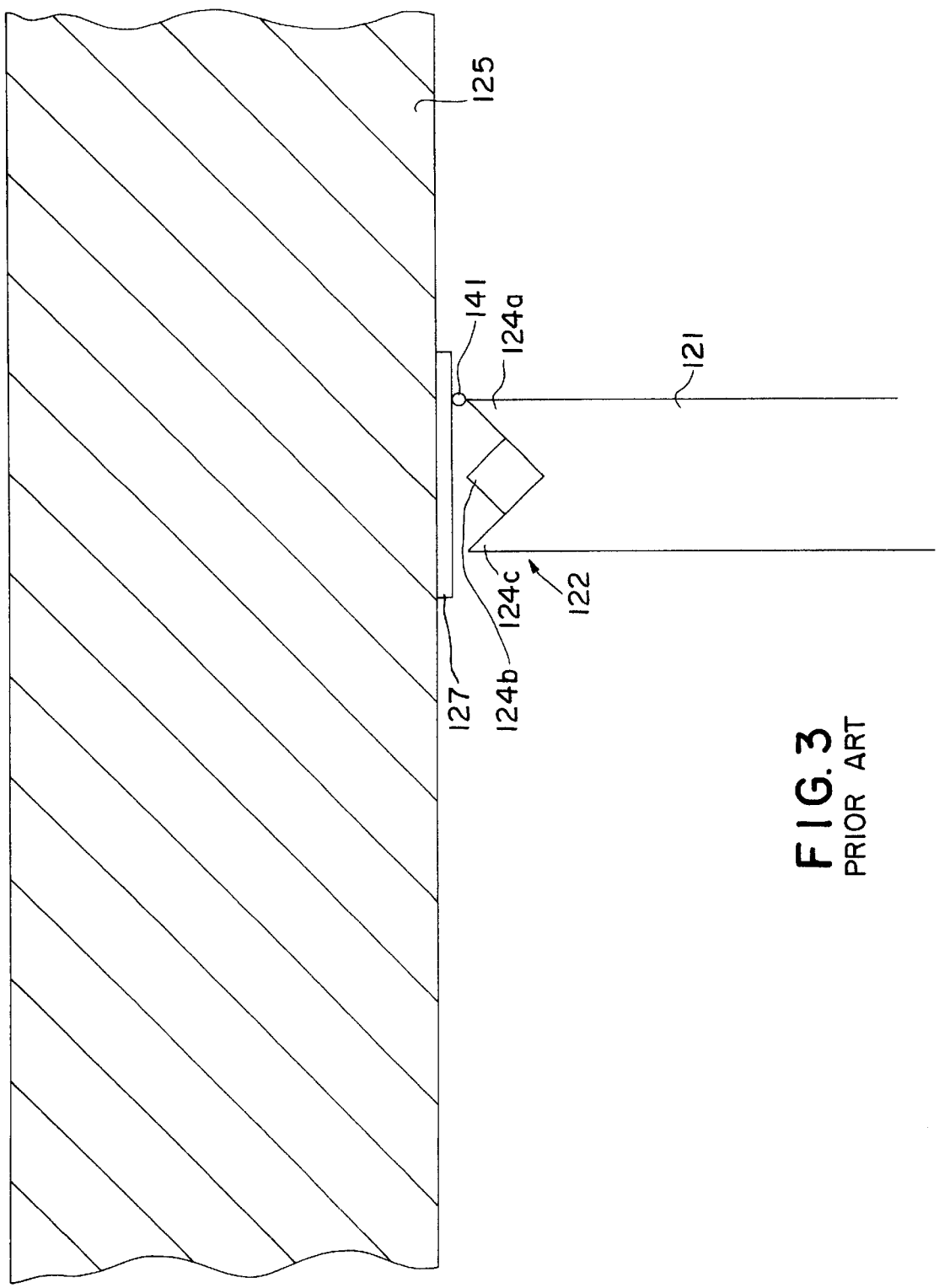
FIG. 3 is an enlarged, side elevational view of a prior art device.

In contrast, as shown in FIG. 3, prior art pogo pin 121 has a head 122 with multiple points 124a–124c rigidly connected to each other and to the remaining length of the pin 121. As such, pin 121 is prevented from making electric contact with I/O pad 127 on substrate 125 by contaminant 141 lying in the path of one of the points 124a.

Referring once again to FIGS. 1 and 2, buckling beams 35a–35d have proximal ends 43 secured to mounts 31, from which they extend substantially parallel to each other to terminate in distal ends 45. The operative length 47 (FIG. 1) of buckling beams 35a–35d is substantially constant, thereby defining a test plane 49 for probe 21. Test plane 49 coincides with the tips of distal ends 45 when in the undeflected position. Test plane 49 moves toward I/O pads 29 when test head 23 is advanced. In the event that distal ends 45 encounter a contaminant, the tips of distal ends 45 are deflected out of test plane 49. In the example shown in FIG. 1, buckling beams 35a for each of the three clusters 33 shown have distal ends 45 deflected out of test plane 49.

The test head 23 is advanced relative to substrate 28 until it reaches a predetermined test position corresponding to a predetermined distance between the test head 23 and substrate 28. When the test position is reached, clusters 33 make the required electrical contact with corresponding I/O pads 29.

The spaced configuration 37 of buckling beams 35a–35d defines a test region with a cross-sectional area 51 lying on test plane 49. This cross-sectional area 51 is not greater than the area of I/O pads 29. In this way, all of the buckling beams 35a–35d are within the outer boundary of their corresponding I/O pads and, as such, all of the buckling beams 35a–35d of a given cluster 33 will be capable of making electrical contact with the corresponding I/O pad 29. Likewise, centers 53 of buckling beams 35a–35d are spaced from each other by a distance not greater than the maximum dimension of I/O pads 29, again, an arrangement which means that all of the buckling beams 35a–35d can be positioned over a single corresponding I/O pad 29 during testing.

The use of the bed-of-nails type probe 21 is readily apparent from the foregoing description. The probe is positioned to align mounts 31 with the array of device features to be tested, in this case, I/O pads 29. The probe 21 and the substrate 28 are moved relative to each other to reduce the distance between distal ends 45 and the conductive surface of pads 29. Any of the buckling beams 35a–35d which encounter contaminant 41 (shown in FIGS. 1 and 2 as buckling beams 35a) laterally deflect in response to such contaminant during the relative movement of the distal ends 45 toward substrate 28. Eventually, probe 21 and substrate 28 are positioned a predetermined distance from each other, at which point the required electrical contact is made between the buckling beams 35b–35d, that is, the beams which were not blocked by contaminant 41. An electrically conductive path is thus created between the buckling beams 35b–35d, connected to corresponding I/O pads 29, and the remainder of the test system for substrate 28. Because each of the buckling beams 35a–35d is electrically connected in parallel, the fact that buckling beams 35a failed to make the electrical connection does not affect the testing of the corresponding I/O pads 29.

The exact number, spacing, and arrangement of buckling beams 35a–35d can be varied to suit the particular array and dimensions of electrical features under test. In general terms, buckling beams 35a–35d range in diameter from 3 to 5 mils, whereas I/O pads 29 are currently about 32 mils in diameter and are spaced from each other by 50 mils center-to-center. In the illustrated embodiment, buckling beams 35a–35d have a diameter of 5 mils, and are spaced from each other by 9 mils center-to-center, giving the cross-sectional area 51 a diameter of about 14 mils when the beams are radially spaced in 90-degree increments as shown in FIG. 2.

As such, the test region defined by cross-sectional area 51 fits readily within the 32-mil diameter of typical I/O pads 29. In addition, buckling beams 35a–35d have a small diameter relative to I/O pads 29. This means that, even if the size of I/O pads 29 is reduced in the future, it will still be possible to use buckling beam clusters 33 for testing I/O pads 29 as part of a needle card-type test probe 21.

An alternate configuration for the buckling-beam cluster 33 is to place only three buckling beams in radially spaced increments of 120 degrees. It has been found preferable in such an arrangement to use buckling beams having a diameter of 3 mils which are spaced from each other by 7 mils center-to-center.

Of course, further variations in the number, size, and arrangement of buckling beams within the clusters 33 are possible, and such variations are within the scope of the present invention. At a minimum, there are two of the buckling beams per cluster 33, so that at least one level of redundancy is provided in the event that one of the buckling beams is impeded by the contaminant 41. Conversely, more than four buckling beams per cluster may be used for applications requiring even greater redundancy.

Although the illustrated device under test is a substrate and the electrically conductive surfaces are I/O pads, probe 21 may also be used to test other electrically conductive features or areas residing on other types of electronic packages or devices. Similarly, although probe 21 in this embodiment is a needle-card or bed-of-nails type of probe, the present invention may find applications which use fewer of the clusters 33, or even just one of the clusters 33.

Test probe 21 can be used with components of any of a variety of testing apparatus. In addition to the features of the probe 21 itself, such an apparatus would have a suitable mechanism for aligning the matrix of clusters 33 with the array of I/O pads 29 or other conductive surfaces. The apparatus would also have structures and logic for moving the clusters 33 and pads 29 relative to each other to the appropriate testing position. Such an apparatus would likewise have suitable electronics, logic controllers, and software to create and evaluate the electrically conductive paths established between the substrate 28 and the buckling beams 35a–35d.

In addition to the advantages apparent from the foregoing description, the test probe 21 of the resent invention is contaminant tolerant, that is, it mains reasonably accurate and operational even when so me of its constituent buckling beams 35a–35d are prevented from making electrical contact because of intervening contaminant 41. This advantage generates a collateral advantage Df reducing the number of false readings of "opens" otherwise generated by typical needle-card probes. Multiple, parallel, and redundant electrically conductive paths extend t rough the clusters 33, with the advantage that the require electrical contact will be made so long as at least one of the beams makes the required electrical connection. The probe has the further advantage of being useful not only on I/O pads 29 of the typical size today, but also on any smaller I/O pads or other surface conducting features if such are developed in the future.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A test probe used in a test system for testing a single pad of a device, the probe comprising:

a test head moveable relative to the device;

a cluster of at least two buckling beams secured to the test head, the buckling beams extending generally outwardly from the test head and terminating in distal ends, each of the buckling beams having strength characteristics selected so as to establish sufficient electrical contact for testing the single pad of the device when the test head is moved into a test position, the buckling beams deflecting laterally when subjected to force other than tensile force, the distal ends of the at least two buckling beams being spaced from each other by a distance not greater than the maximum linear dimension of the single pad being tested; and means for electrically connecting each of the buckling beams in a cluster in parallel, the means for electrically connecting including a space transformer secured to the test head, the buckling beams having proximal ends electrically connected to the space transformer;

whereby, when the test head is in the test position, the test head is electrically connected to the single pad under test even if only one of the buckling beams contacts the pad.

2. The probe of claim 1, wherein the buckling beams have proximal ends secured at spaced locations on the probe, and wherein the beams extend substantially parallel to each other.

3. The probe of claim 1, further comprising at least three of the buckling beams and means for locating the distal ends of the cluster to define a test region with a predetermined cross-sectional area, the cross-sectional area being not greater than the area to be tested.

4. The probe of claim 1 for use in testing features which may have a contaminant thereon, wherein the buckling beams deflect in response to encountering the contaminant during movement of the test head into the test position.

5. The probe of claim 1 further comprising from three to five of the buckling beams with proximal ends mounted to the test head in a radial configuration, the beams extending substantially parallel to each other.

6. The probe of claim 5, comprising only three of the buckling beams, adjacent buckling beams being spaced from each other by a linear distance of about 10 mils center-to-center and by a radial arc of about 120 degrees, wherein the buckling beams have diameters ranging between about 3 mils to about 5 mils, and have substantially equal operative lengths.

7. A contaminant-tolerant, bed-of-nails type probe for testing pads of a device under test, the probe comprising:
  a test head moveable relating to the device,
  a plurality of buckling beam clusters for making electrical contact with the pads being tested, the buckling beam clusters being positionable over corresponding ones of the pads of the device under test and moveable relative to the pads of the device until electrical contact is made therewith, the buckling beam clusters extending outwardly from the test head and terminating in distal ends,
  each cluster having at least two buckling beams of electrically conductive material, the buckling beams having proximal ends electrically connected to and secured at spaced locations on the probe and extending outwardly therefrom to terminate in distal ends, the buckling beams deflecting laterally when subjected to axial force, and
  means for electrically connecting each of the buckling beams in parallel and including a space transformer secured to the test head, the buckling beams having proximal ends electrically connected to the space transformer,
  wherein, for a given one of the clusters, the distal ends are spaced laterally from each other by a distance not greater than the maximum dimension of the corresponding pad under test, the maximum dimension of the corresponding pads under test defining a boundary, all of the distal ends of the given cluster being within the boundary when the clusters are in operative proximity to the device under test;
  the given cluster making electrical contact sufficient to test the corresponding pad when only one of the buckling beams contacts the corresponding pad.

8. The probe of claim 7, wherein the beams have substantially the same operative length to define a test plane for the probe coinciding with the distal ends, the test plane moving toward the areas under test when the clusters are moved relatively toward the device, the distal ends of the beams deflecting out of the test plane in the event the distal ends encounter the contaminant during relative movement of the test plane toward the areas under test,
  each cluster making electrical contact with a corresponding area under test when the contaminant is present on a portion of the area under test so long as at least one beam of the cluster does not contact the contaminant.

9. The probe of claim 7 for testing I/O pads ranging in diameter from 20 to 40 mils, wherein each of the clusters comprises at least three of the buckling beams, wherein the distal ends of the beams define a test region with a predetermined cross-sectional area, the cross-sectional area being not greater than the area of the I/O pad to be tested.

10. The probe of claim 9, wherein adjacent ones of the buckling beams are spaced from each other by a linear distance of about 10 mils center-to-center and a radial arc of about 120 degrees, wherein the buckling beams include copper therein, and have diameters ranging between about 3 mils to about 5 mils.

11. A contaminant-tolerant, bed-of-nails type test probe for I/O pads, the probe comprising:
  a test head adapted to be moved relative to the I/O pads to make electrical contact with the I/O pads during testing thereof;
  a space transformer secured to the test head, the space transformer having a surface with a predetermined number of mounts at spaced locations thereon, the mounts corresponding one-for-one to the I/O pads to be tested;
  a buckling beam cluster contacting and extending from each of the mounts so that there is one cluster for each one of the I/O pads to be tested, the cluster comprising at least two, substantially parallel, spaced buckling beams of conductive material, each of the buckling beams of a given cluster having a proximal end electrically connected to the space transformer and a distal end for contacting a corresponding one of the I/O pads, whereby the buckling beams comprise parallel electrically conductive paths; and
  the buckling beams of each cluster having substantially the same operative length and deflecting laterally when subjected to an axial force, any of the buckling beams contacting a contaminant being deflected as the test head is moved relatively toward the I/O pads, and any of the buckling beams not contacting the contaminant being movable until electrical contact is made with the corresponding I/O pad to create an electrically conductive path through the cluster to the test head.

12. The probe of claim 11, comprising only three to five of the buckling beams, and wherein adjacent ones of the buckling beams are spaced from each other by a linear distance of about 10 mils center-to-center end a radial arc of about 120 degrees, wherein the buckling beams include copper therein, and have diameters ranging between about 3 mils to about 5 mils.

13. The probe of claim 11, wherein the mounts are arranged in rows and columns, wherein each of the clusters comprises at least four of the buckling beams arranged on the corresponding mounts in a radial configuration, the distal ends of the buckling beams defining a cross-sectional area less than the area of the I/O pads to be tested.

14. A method of electrically testing an array of device pads with a needle card-type test probe electrically connected to a test system, the probe including a test head moveable relating to the device pads, and a space transformer secured to the test head, the pads possibly having a contaminant on some of their conductive surfaces, the method comprising:
  securing buckling-beam clusters to the test probe in a matrix corresponding to the array of device pads to be tested, each buckling-beam cluster including at least two buckling beams, the buckling-beams of individual clusters extending outwardly from the test head and terminating in distal ends;

spacing the buckling beams of each cluster from each other by a distance less than the maximum linear dimension of the corresponding pad to be tested so that only one cluster is adapted to contact only one pad;

electrically connecting the buckling beams of individual clusters in parallel, so that each buckling beam of the cluster defines an independent conductive path to the test system, including electrically contacting proximal ends of the buckling beams to the space transformer;

aligning the probe with the array of device pads to be tested, the clusters having distal ends proximate to the array of device pads;

moving the probe and the device relative to each other to reduce the distance between the distal ends and the device pads;

laterally deflecting any of the buckling beams which contact the contaminant during relative movement of the distal ends toward the device under test;

reducing the distance between the distal ends and the device features until electrical contact is made between the buckling beams which did not encounter the contaminant and the device pads; and creating an electrically conductive path between the buckling beams in electrical contact with the device pads to test the device.

15. The method of claim 14, wherein the features to be tested comprise I/O pads and further comprising the step of providing each of the clusters with at least two of the buckling beams.

16. A method of improving the number of electrical contacts made between, a) an array of pads to be tested on a device some of which may have a contaminant thereon and, b) corresponding locations on a needle-type test probe, the probe including a test head moveable relative to the device pads, and a space transformer secured to the test head, the method comprising:

securing buckling beam clusters to the test probe in a matrix corresponding to the array of pads to be tested, each of the clusters having at least two buckling beams, the buckling-beams of individual clusters extending outwardly from the test head and terminating in distal ends;

spacing the buckling beams of each cluster from each other by a distance less than the maximum linear dimension of the corresponding pad to be tested so that only one cluster is adapted to contact only one pad;

aligning the buckling beams to be substantially parallel to each other and to have substantially equal operative lengths, whereby distal ends of the buckling beams define a test plane;

electrically connecting the buckling beams of individual clusters in parallel, so that each buckling beam of the cluster defines an independent conductive path, including electrically contacting proximal ends of the buckling beams to the space transformer;

aligning the probe with the array of device pads to be tested, the distal ends of the clusters being proximate to the array of device pads; and moving the probe and the device relative to each other until any of the buckling beams contacting the contaminant have been deflected and any of the buckling beams not contacting the contaminant have made electrical contact with the corresponding pad, thereby making electrical contact with substantially all pads to be tested, and improving the accuracy of the related testing procedures.

17. The method of claim 16, further comprising the step of providing each cluster with between two and five of the buckling beams.

18. An apparatus for testing an array of device pads which may have a contaminant on some of their conductive surfaces, the apparatus comprising:

a test probe electrically connected to a test system;

means for securing buckling beam clusters to the test probe in a matrix corresponding to the array of device pads to be tested, the buckling beams of individual clusters extending outwardly from the test probe and terminating in distal ends;

means for spacing the buckling beams of each cluster from each other by a distance less than the maximum linear dimension of the corresponding pad to be tested so that only one cluster, which includes at least two buckling beams, is adapted to contact only one pad;

means for electrically connecting the buckling beams of individual clusters in parallel, the means for electrically connecting including a space transformer secured to the test head, the buckling beams having proximal ends electrically connected to the space transformer;

means for aligning the clusters with the array of device pads to be tested, the clusters having distal ends proximate to the array of device pads;

means for moving the test probe and the device relative to each other to reduce the distance between the distal ends and the device pads;

the buckling beams deflecting laterally in response to contact with the contaminant; and means for reducing the distance between the distal ends and the device pads until electrical contact is made between the buckling beams which did not encounter the contaminant and the device pads.

* * * * *